United States Patent
Maguire et al.

(10) Patent No.: US 11,917,779 B2
(45) Date of Patent: Feb. 27, 2024

(54) COVER ASSEMBLY WITH DAMPING HINGE

(71) Applicant: Dell Products L.P., Round Rock, TX (US)

(72) Inventors: Amrita Sidhu Maguire, Cedar Park, TX (US); Alice Aigin Liu, Shanghai (CN); Sam Shang, Shanghai (CN); Anthony Sanchez, Pflugerville, TX (US); Yuxin Chen, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 4 days.

(21) Appl. No.: 17/194,945

(22) Filed: Mar. 8, 2021

(65) Prior Publication Data

US 2022/0287194 A1 Sep. 8, 2022

(51) Int. Cl.
*G06F 1/16* (2006.01)
*H05K 5/00* (2006.01)
*H05K 5/02* (2006.01)
*H05K 7/00* (2006.01)
*H05K 7/14* (2006.01)

(52) U.S. Cl.
CPC ......... *H05K 5/0226* (2013.01); *H05K 7/1494* (2013.01)

(58) Field of Classification Search
CPC .. H05K 5/0226; H05K 7/1494; H05K 5/0217; H05K 5/0204; H05K 5/0221; H05K 5/023; H05K 5/0234; H05K 5/0243; H05K 5/0256; H05K 5/03; H05K 5/04; H05K 7/1489; H05K 7/1488; H05K 7/1487; H05K 7/1485; H05K 7/1427; H05K 7/1421; H05K 7/1411; H05K 7/1401; H05K 7/14
See application file for complete search history.

(56) References Cited

U.S. PATENT DOCUMENTS

| | | | |
|---|---|---|---|
| 2013/0182396 A1* | 7/2013 | Hu | G06F 1/1681 |
| | | | 16/302 |
| 2018/0042129 A1* | 2/2018 | Park | E05D 3/12 |
| 2020/0371563 A1* | 11/2020 | Collins | H05K 7/16 |
| 2021/0307185 A1* | 9/2021 | Hong | H05K 5/0226 |
| 2021/0355986 A1* | 11/2021 | Oldani | H04M 1/0216 |

* cited by examiner

*Primary Examiner* — Anthony M Haughton
(74) *Attorney, Agent, or Firm* — Jackson Walker L.L.P.

(57) ABSTRACT

A modular information handling system may include one or more information handling resources and an enclosure configured to house the one or more information handling resources, the enclosure comprising a topside cover comprising: a fixed portion mechanically fixed to a remaining portion of the enclosure, a movable portion, and a damping hinge configured to rotatably couple the movable portion to the fixed portion about an axis of rotation defined by the damping hinge, wherein the damping hinge is configured to dampen mechanical rotation of the movable portion relative to the fixed portion when the movable portion mechanically moves towards a closed position relative to the fixed portion.

15 Claims, 3 Drawing Sheets

COVER ASSEMBLY WITH DAMPING HINGE

TECHNICAL FIELD

The present disclosure relates to modular information handling systems. More specifically, embodiments of the disclosure provide systems and methods for a cover assembly for covering all or a portion of such a modular information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Oftentimes, information handling systems are each manufactured in a modular form factor and may be configured to be disposed in a chassis (e.g., a server rack, a server tower, a storage area network device, etc.) configured to receive such modular components. Such a chassis and its component modular information handling systems typically include various rails, carriers, and other mechanical components allowing for a person to add and remove the modular information handling systems from the chassis.

In some instances, a modular information handling system may have its own enclosure, including a cover that may be removable or foldable to permit access to components of the modular information handling system. Accordingly, to service a modular information handling system, a user may fully or partially remove the modular information handling system from its bay within a chassis, and remove or fold the cover to access components of the modular information handling system.

In the case of a foldable cover, a cover assembly may include a fixed portion relative to the enclosure of the modular information handling system, and a door-like movable portion coupled via a hinge to the fixed portion allowing the movable portion to rotate relative to the fixed portion about an axis defined by one or more hinges.

A particular application in which a foldable cover may be used for permitting access to air movers (e.g., fans or blowers) of a modular information handling system. In such scenarios, the movable portion of a cover may be located physically proximate to air movers enclosed by the enclosure, and opening the movable portion permits access to the air movers for servicing, insertion, and/or removal. In such an application, opening the movable portion of the cover may cause a drop in airflow from air movers within the enclosure due to air leakage from the enclosure. Further, the open cover of one enclosure may impede inlet airflow to another adjacent enclosure in the same chassis. Should a movable portion of a cover remain open for a significant period of time, the drop in airflow in one enclosure and/or the impeded inlet airflow of another enclosure may lead to undesirable thermal conditions. Such an occurrence may happen in which a technician opens a movable portion of a cover for servicing and forgets to close the movable portion. Runaway thermal conditions may present a risk of damage and/or data loss, and must be avoided to ensure proper functioning of an information handling system.

SUMMARY

In accordance with the teachings of the present disclosure, the disadvantages and problems associated with traditional approaches to providing a cover for a modular information handling system may be substantially reduced or eliminated.

In accordance with embodiments of the present disclosure, a modular information handling system may include one or more information handling resources and an enclosure configured to house the one or more information handling resources, the enclosure comprising a topside cover comprising: a fixed portion mechanically fixed to a remaining portion of the enclosure, a movable portion, and a damping hinge configured to rotatably couple the movable portion to the fixed portion about an axis of rotation defined by the damping hinge, wherein the damping hinge is configured to dampen mechanical rotation of the movable portion relative to the fixed portion when the movable portion mechanically moves towards a closed position relative to the fixed portion.

In accordance with these and other embodiments of the present disclosure, a cover configured to at least partially house one or more components may include a fixed portion, a movable portion, and a damping hinge configured to rotatably couple the movable portion to the fixed portion about an axis of rotation defined by the damping hinge, wherein the damping hinge is configured to dampen mechanical rotation of the movable portion relative to the fixed portion when the movable portion mechanically moves towards a closed position relative to the fixed portion.

In accordance with these and other embodiments of the present disclosure, a method may include mechanically coupling a fixed portion of a cover configured to at least partially house one or more components to a movable portion via a damping hinge configured to rotatably couple the movable portion to the fixed portion about an axis of rotation defined by the damping hinge, wherein the damping hinge is configured to dampen mechanical rotation of the movable portion relative to the fixed portion when the movable portion mechanically moves towards a closed position relative to the fixed portion.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 4, wherein like numbers are used to indicate like and corresponding parts. For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

In this disclosure, the term "information handling resource" may broadly refer to any component system, device or apparatus of an information handling system, including without limitation processors, buses, memories, input-output devices and/or interfaces, storage resources, network interfaces, motherboards, electro-mechanical devices (e.g., fans), displays, and power supplies.

Figure 1:
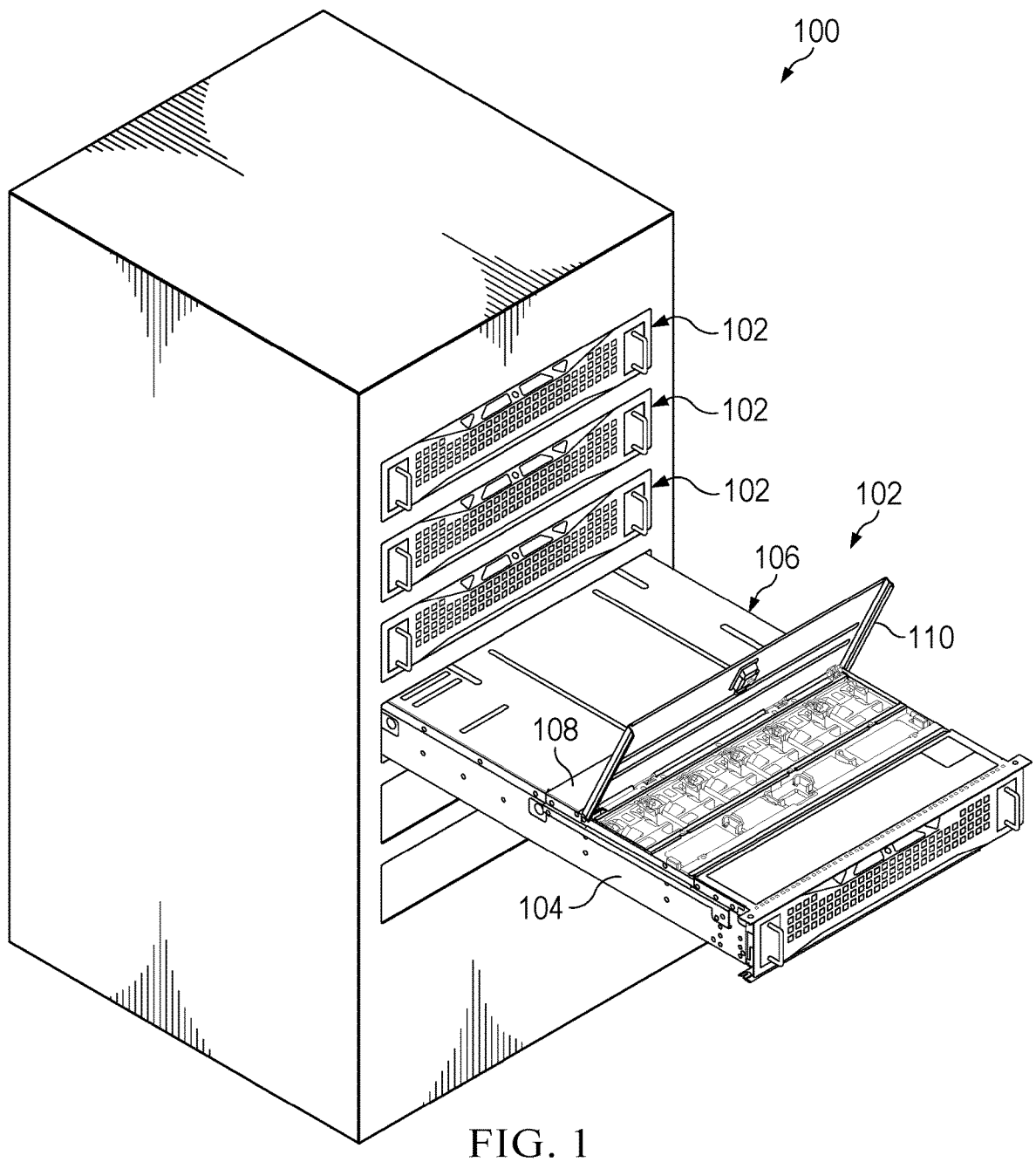
FIG. 1 illustrates a perspective view of an example chassis for receiving modular information handling systems, in accordance with embodiments of the present disclosure.

FIG. 1 illustrates a perspective view of an example chassis 100 for receiving modular information handling systems, in accordance with embodiments of the present disclosure. Chassis 100 may be an enclosure that serves as a container for various information handling systems 102, and may be constructed from steel, aluminum, plastic, and/or any other suitable material. Although the term "chassis" is used, chassis 100 may also be referred to as a case, cabinet, tower, box, enclosure, and/or housing. In certain embodiments, chassis 100 may be configured to hold and/or provide power to a plurality of information handling systems 102.

As shown in FIG. 1, a modular information handling system 102 may include an enclosure 104 for housing components of modular information handling system 102. Further as shown in FIG. 1, enclosure 104 may include a cover 106 configured to enclose components of modular information handling system 102 from the topside of modular information handling system 102. Cover 106 may include a fixed portion 108 configured to generally remain fixed in position relative to the remainder of enclosure 104 and a movable portion 110 coupled via one or more hinges to fixed portion 108 such that movable portion 110 may rotate relative to fixed portion 108 about an axis defined by one or more hinges, as described in greater detail below. Accordingly, a technician may perform servicing of components of a modular information handling system 102 by fully or partially removing such modular information handling system 102 from chassis 100 and opening movable portion 110 relative to fixed portion 108 to access any components (e.g., air movers) requiring servicing, insertion, and/or removal from enclosure 104.

Figure 2:
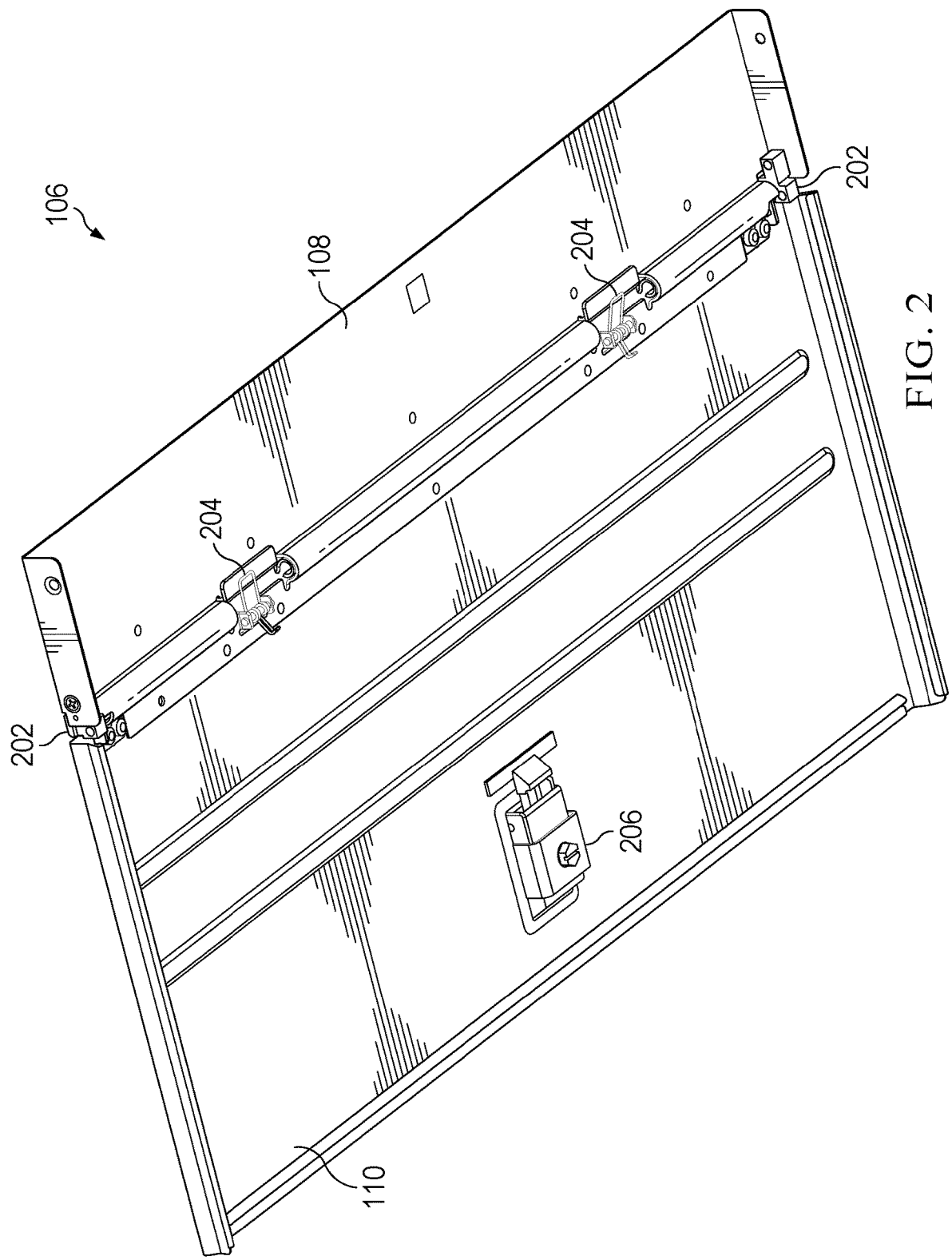
FIG. 2 illustrates a perspective view of a bottom of an example cover for an enclosure of a modular information handling system, in accordance with embodiments of the present disclosure.
Figure 3:
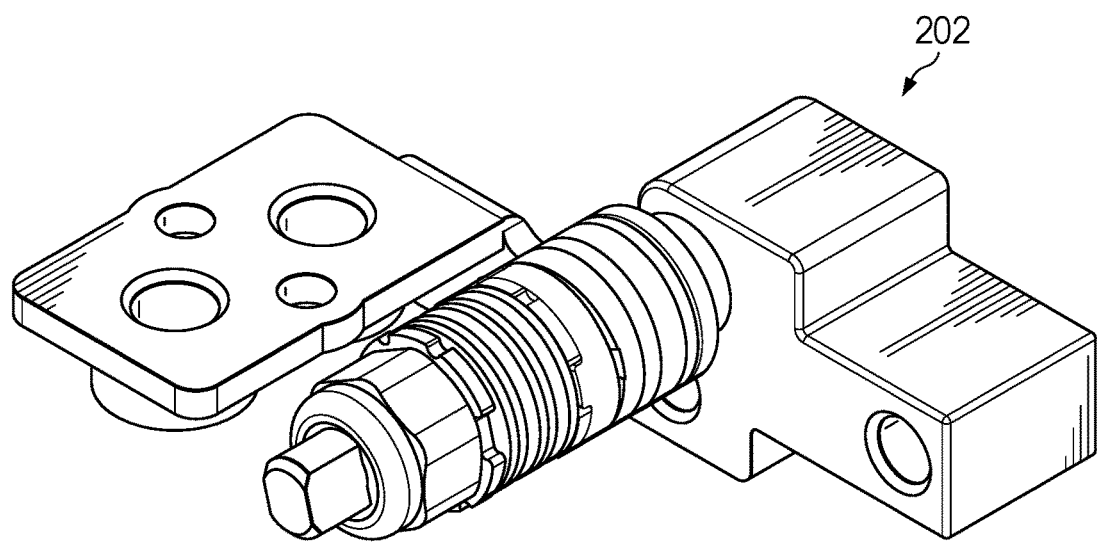
FIG. 3 illustrates a perspective view of an example damping hinge, in accordance with embodiments of the present disclosure.

FIG. 2 illustrates a perspective view of a bottom of an example cover 106 for an enclosure 104 of a modular information handling system 102, in accordance with embodiments of the present disclosure. As shown in FIG. 2, movable portion 110 may be coupled via one or more hinges to fixed portion 108 such that movable portion 110 may rotate relative to fixed portion 108 about an axis defined by one or more damping hinges 202. An example of a damping hinge 202 is depicted in FIG. 3. As described in greater detail below, a damping hinge 202 may include mechanical damping features configured to dampen rotation of movable portion 110 relative to fixed portion 108 as movable portion 110 closes to fixed portion 108 (e.g., closes as a result of the effect of gravity upon movable portion 110). For example, damping hinge 202 may have a variable torque that is a function of the position of movable portion 110 relative to fixed portion 108 (e.g., has maximum torque at zero degrees of rotation and zero torque at 90 degrees of rotation). Such damping may prevent damage to components of information handling system 102 that may result from movable portion 110 slamming into a closed position under the influence of gravity (or other force) as well as protecting body parts (e.g., hands) of a technician from injury as a result of such slamming.

As further shown in FIG. 2, one or more spring assemblies 204 may be mechanically coupled between fixed portion 108 and movable portion 110. A spring assembly 204 may be configured to apply a spring force between fixed portion 108 and movable portion 110 to force movable portion 110 toward its closed portion when movable portion 110 is opened relative to fixed portion 108 beyond a particular angle (e.g., when movable portion 110 is opened 90 degrees or more from its closed position). Thus, if movable portion 110 is rotated to a position (e.g., more than 90 degrees from its closed position) in which the influence of gravity would tend to maintain movable portion 110 in an open position relative to fixed portion 108, the spring force applied by spring assembly 204 may cause movable portion 110 to rotate relative to fixed portion 108 such that movable portion 110 moves into a position in which it may completely close to its closed position under the influence of gravity.

Figure 4:
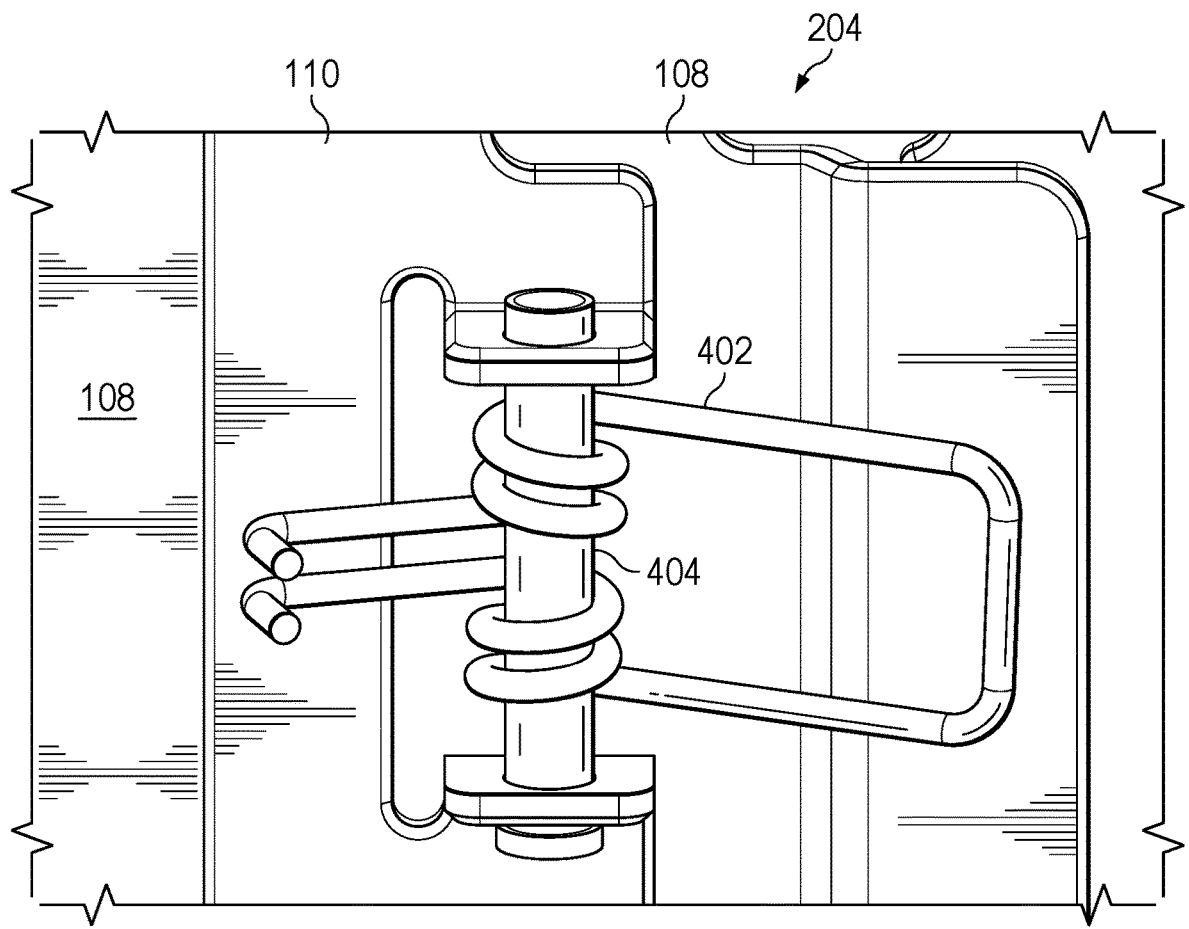
FIG. 4 illustrates a perspective view of an example spring assembly, in accordance with embodiments of the present disclosure.

An example of a spring assembly 204 is shown in FIG. 4. As shown in FIG. 4, spring assembly 204 may include hinge feature 404 configured to rotationally couple movable portion 110 relative to fixed portion 108 about an axis of such hinge feature (which may be the same axis by which damping hinge(s) 202 rotationally couple movable portion 110 relative to fixed portion 108). Further, spring feature 204 may include a torsion spring 402 configured to apply a spring force between fixed portion 108 and movable portion 110 to force movable portion 110 toward its closed portion when movable portion 110 is opened relative to fixed portion 108 beyond a particular angle (e.g., when movable portion 110 is opened 90 degrees or more from its closed position). As further shown in FIG. 2, cover 106 may also include a latch 206 which may mechanically engage with a corresponding mechanical feature of enclosure 104 (not explicitly shown) to maintain movable portion 110 in its closed position, unless latch 206 is otherwise engaged by a technician or other person to unlatch movable portion 110 from the corresponding mechanical feature of enclosure 104. In some embodiments, the torque of damping hinge 202 may be tuned to overcome a spring force associated with latch 206, to allow closing of movable portion 110 relative to fixed portion 108 to engage latch 206.

Further, although not shown in FIG. 2, enclosure 104 may have other features configured to assist in mechanically retaining movable portion 110 in its fixed position. For example, in some embodiments, enclosure 104 may include one or more magnets configured to apply a magnetic force to metal forming all or part of movable portion 110 in order to assist in mechanically retaining movable portion 110 in its fixed position.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A modular information handling system, comprising:
   one or more information handling resources; and
   an enclosure configured to house the one or more information handling resources, the enclosure comprising a topside cover comprising:
      a fixed portion mechanically fixed to a remaining portion of the enclosure;
      a movable portion;
      a damping hinge configured to rotatably couple the movable portion to the fixed portion about an axis of rotation defined by the damping hinge, wherein the damping hinge is configured to dampen mechanical rotation of the movable portion relative to the fixed portion when the movable portion mechanically moves towards a closed position relative to the fixed portion; and
      a spring assembly configured to exert a mechanical spring force on the movable portion relative to the fixed portion to force the movable portion toward the closed position when the movable portion is opened relative to the fixed portion.

2. The modular information handling system of claim 1, wherein the spring assembly is configured to exert the mechanical spring force on the movable portion relative to the fixed portion to force the movable portion toward the closed position when the movable portion is opened relative to the fixed portion beyond a particular angle relative to the closed position.

3. The modular information handling system of claim 2, wherein the particular angle is 90 degrees.

4. The modular information handling system of claim 2, wherein the spring assembly comprises a torsional spring configured to exert the mechanical spring force.

5. The modular information handling system of claim 2, wherein the spring assembly comprises a hinge feature rotationally coupling the movable portion to the fixed portion about the rotational axis.

6. A cover configured to at least partially house one or more components, the cover comprising:

a fixed portion;

a movable portion;

a damping hinge configured to rotatably couple the movable portion to the fixed portion about an axis of rotation defined by the damping hinge, wherein the damping hinge is configured to dampen mechanical rotation of the movable portion relative to the fixed portion when the movable portion mechanically moves towards a closed position relative to the fixed portion; and a spring assembly configured to exert a mechanical spring force on the movable portion relative to the fixed portion to force the movable portion toward the closed position when the movable portion is opened relative to the fixed portion.

7. The cover of claim 6, wherein the spring assembly is configured to exert the mechanical spring force on the movable portion relative to the fixed portion to force the movable portion toward the closed position when the movable portion is opened relative to the fixed portion beyond a particular angle relative to the closed position.

8. The cover of claim 7, wherein the particular angle is 90 degrees.

9. The cover of claim 7, wherein the spring assembly comprises a torsional spring configured to exert the mechanical spring force.

10. The cover of claim 7, wherein the spring assembly comprises a hinge feature rotationally coupling the movable portion to the fixed portion about the rotational axis.

11. A method comprising:

mechanically coupling a fixed portion of a cover configured to at least partially house one or more components to a movable portion via a damping hinge configured to rotatably couple the movable portion to the fixed portion about an axis of rotation defined by the damping hinge, wherein the damping hinge is configured to dampen mechanical rotation of the movable portion relative to the fixed portion when the movable portion mechanically moves towards a closed position relative to the fixed portion, and further comprising mechanically coupling a spring assembly between the fixed portion and the movable portion, the spring assembly configured to exert a mechanical spring force on the movable portion relative to the fixed portion to force the movable portion toward the closed position when the movable portion is opened relative to the fixed portion.

12. The method of claim 9, wherein the spring assembly is configured to exert the mechanical spring force on the movable portion relative to the fixed portion to force the movable portion toward the closed position when the movable portion is opened relative to the fixed portion beyond a particular angle relative to the closed position.

13. The method of claim 12, wherein the particular angle is 90 degrees.

14. The method of claim 12, wherein the spring assembly comprises a torsional spring configured to exert the mechanical spring force.

15. The method of claim 12, wherein the spring assembly comprises a hinge feature rotationally coupling the movable portion to the fixed portion about the rotational axis.

* * * * *